(12) United States Patent
Soares et al.

(10) Patent No.: US 8,498,122 B2
(45) Date of Patent: Jul. 30, 2013

(54) COMMUNICATION PROTOCOL INTERFACE MODULE

(75) Inventors: Itamar F. Soares, Joinville (BR);
Sandro M. Ferrari, Joinville (BR);
Demerson L. Agostinho, Joinville (BR)

(73) Assignee: Weg Automação S/A, Santa Catarina (BR)

( * ) Notice: Subject to any disclaimer, the term of this patent is extended or adjusted under 35 U.S.C. 154(b) by 194 days.

(21) Appl. No.: 12/772,548

(22) Filed: May 3, 2010

(65) Prior Publication Data
US 2010/0277874 A1 Nov. 4, 2010

(30) Foreign Application Priority Data
May 4, 2009 (BR) .................................... 0901450

(51) Int. Cl.
*H05K 7/00* (2006.01)
(52) U.S. Cl.
USPC ......................................................... 361/728
(58) Field of Classification Search
None
See application file for complete search history.

(56) References Cited

U.S. PATENT DOCUMENTS

| | | | | |
|---|---|---|---|---|
| 5,001,516 A * | 3/1991 | Maruyama et al. | ............... | 399/90 |
| 5,340,340 A * | 8/1994 | Hastings et al. | ................ | 439/64 |
| 5,764,480 A * | 6/1998 | Crump et al. | ........... | 361/679.31 |
| 6,185,095 B1 * | 2/2001 | Helot et al. | ............... | 361/679.44 |
| 6,272,019 B1 * | 8/2001 | Edwards et al. | ............... | 361/760 |
| 6,351,376 B1 * | 2/2002 | Liang et al. | ............... | 361/679.33 |
| 6,594,150 B2 * | 7/2003 | Creason et al. | ................ | 361/727 |
| 6,724,636 B2 * | 4/2004 | Yamamoto et al. | ........... | 361/747 |
| 6,823,232 B2 * | 11/2004 | Murphy | ........................ | 700/180 |
| 6,864,573 B2 * | 3/2005 | Robertson et al. | ............... | 257/718 |
| 7,061,767 B2 * | 6/2006 | Schmidtke et al. | ............ | 361/724 |
| 7,079,381 B2 * | 7/2006 | Brehm et al. | ............ | 361/679.33 |
| 7,109,831 B2 * | 9/2006 | McMiller et al. | ............... | 334/88 |
| 7,265,996 B2 * | 9/2007 | Fan et al. | ........................ | 361/801 |
| 7,525,805 B2 * | 4/2009 | Yamanishi et al. | ........... | 361/730 |
| 7,573,726 B1 * | 8/2009 | Cote et al. | ...................... | 361/798 |
| 7,609,528 B2 * | 10/2009 | Freimuth et al. | ............... | 361/801 |
| 7,983,797 B2 * | 7/2011 | Rasmussen et al. | .......... | 700/286 |
| 2003/0065855 A1 * | 4/2003 | Webster | ........................ | 710/260 |
| 2003/0103335 A1 * | 6/2003 | Skradde et al. | ............... | 361/730 |
| 2003/0117778 A1 * | 6/2003 | Korsunsky et al. | ........... | 361/728 |
| 2003/0117779 A1 * | 6/2003 | Gough et al. | .................. | 361/728 |
| 2003/0198026 A1 * | 10/2003 | Bui | ............................ | 361/728 |
| 2004/0008494 A1 * | 1/2004 | Roth | ............................. | 361/736 |
| 2004/0105239 A1 * | 6/2004 | Chiang | .......................... | 361/728 |
| 2004/0153594 A1 * | 8/2004 | Rotvold et al. | ............... | 710/305 |
| 2004/0205265 A1 * | 10/2004 | Ling et al. | ......................... | 710/28 |
| 2005/0028037 A1 * | 2/2005 | Junk et al. | .......................... | 714/39 |
| 2005/0066104 A1 * | 3/2005 | Train et al. | ...................... | 710/305 |
| 2005/0111201 A1 * | 5/2005 | Suekawa et al. | ............... | 361/732 |
| 2005/0286237 A1 * | 12/2005 | Barile et al. | .................... | 361/728 |
| 2006/0224811 A1 * | 10/2006 | Sichner et al. | ................ | 710/306 |
| 2006/0245169 A1 * | 11/2006 | Freimuth et al. | ............... | 361/729 |
| 2006/0268528 A1 * | 11/2006 | Zadesky et al. | ................ | 361/728 |
| 2007/0223189 A1 * | 9/2007 | Chiang et al. | .................. | 361/685 |
| 2007/0238018 A1 * | 10/2007 | Lee et al. | ........................ | 429/159 |
| 2007/0293954 A1 * | 12/2007 | Pfingsten et al. | ............... | 700/22 |
| 2008/0043427 A1 * | 2/2008 | Lee et al. | ........................ | 361/687 |
| 2008/0188104 A1 * | 8/2008 | Endou et al. | ................... | 439/157 |
| 2008/0192414 A1 * | 8/2008 | Metral | ........................... | 361/679 |

(Continued)

*Primary Examiner* — Lisa Lea Edmonds
*Assistant Examiner* — Xanthia C Cunningham

(57) ABSTRACT

A communication protocol interface module conceived to be applied to an electromechanical equipment (1) provided with an opening (3) for coupling the module (2) that is provided with an electronic board (11) inside same having a circuit for defining the communication protocols.

6 Claims, 3 Drawing Sheets

U.S. PATENT DOCUMENTS

2009/0046435 A1* 2/2009 Hirota et al. .................. 361/728
2009/0122496 A1* 5/2009 Nishimoto et al. ........... 361/728
2009/0141458 A1* 6/2009 Liu et al. ....................... 361/728
2009/0190315 A1* 7/2009 Maly ............................. 361/728
2010/0323071 A1* 12/2010 Nevarez et al. ............... 426/231

* cited by examiner

COMMUNICATION PROTOCOL INTERFACE MODULE

This application claims the benefit of Brazilian Patent Application No. PI 0901450-0 of May 4, 2009.

The present invention is directed to a communication protocol interface module that allows for an interchangeable link between two industrial communication networks without the need to use a gateway.

As is known by one skilled in the art, industrial protective relays provided with an industrial communication network are already found in the marketplace, some models of which make it possible to use more than one communication protocol by using a gateway between two industrial communication networks.

The implementation of industrial communication networks in engine protective relays is required in new plants, in view of the need to integrate and control the process, in order to make it possible to visualize the information generated through a control software.

Presently, protective relays use a single communication protocol integrated to the hardware of the product, but there is no provision for a protocol exchange in the event it might be required. Other relays use communication gates between two networks or gateways to translate the protocol into a common protocol. However, this solution brings about data transfer rates lower than the original protocol. Further, this solution has drawbacks that result in a higher volume, a lower speed and less flexibility in the equipment, when compared to the original protocol.

It is known that most of the communication networks are based on the "Open System Interconnection" (OSI) model that is a reference model published by the International Organization for Standardization (ISO) in 1984 and defines a seven-layer architecture for interconnecting heterogeneous computational systems. This model serves as a base for most communication network protocols, and divides the communication process into better manageable tasks.

Thus, a task or a set of tasks is designed for each of the seven layers that act completely independent from one another. This makes it possible to update the solutions offered per layer without affecting the other layers.

The original OSI model specifies the layers according to the table below:
Application
Presentation
Session
Transportation
Network
Data link
Physical Application Layer: It defines an interface for the user's communication and data transfer over the network;

Presentation Layer: Responsible for specifying an architecture that can mask different data shapes between heterogeneous systems, thus allowing the applications to be transparent to such shapes;

Session Layer: It manages the sessions and the dialogues of users, besides controlling the beginning and end of logical communication channels;

Transportation Layer: It manages the delivery of point-to-point messages in the network. Also, it provides deliveries regarding the connection, where a logical channel is defined for the data flow, acting in a trustworthy and sequential way; and that of services not regarding the connection, where each data package is delivered independently with relation to the others without any delivery confirmation;

Network Layer: It determines how the data are transferred between network devices and routes of packages according to the only device address in the network;

Data Link Layer: It defines the procedures to operate communication channels, manipulate frames (packages), detect and correct data communication errors;

Physical Layer: It defines optic, electric and mechanical characteristics of the signals that represent the data that travel over the network. Further, it is responsible for the interface between the system and the communication channel.

Although this model is provided with wide modularity features, with well-defined task shares, the OSI Reference Model is presently considered to be a very complex architecture that is hard to be implemented.

The hierarchic control levels in industrial environments require communication networks with different determinism degrees, depending on the requirements thereof. In this case the determinism is mostly affected by the complexity of the protocols involved in the communication process. The messages that travel over the network at the control and plant level make it possible to use a layered architecture similar to the OSI model because they do not exhibit a too high determinism degree.

Field networks such as simple computer networks should have a similar architecture, but the basic requirements in this type of network prevent the use of an overall architecture provided with seven layers, in view of the following factors:
the transmission of sensors and actuators status over high level networks is undesirable due to the long access times in such networks. In view of that, the Network Layer is not required;
the Transportation Layer may be omitted, since "broadcast" and "multicast" addressing is not supported in this layer;
the Session Layer, that is very close to the transportation layer, is not relevant in the context of field networks.

Thus, the field network presents the following architecture:
Application
Data Link
Physical Application Layer: It provides high level services available to user's tasks. Further, it contains other elements: a service that includes synchronization primitives and others that are responsible for the management of the network, and responsible for the configuration, control and monitoring of the communication resources;

Data Link Layer: Responsible for the encapsulation of data in frames in accordance with the criteria for controlling access to the physical environment. The Data Link Layer implements the environment access layer (MAC) and defines different real time schedule algorithms for the network determinism;

Physical Layer: It defines the physical interface between the station and the communication channel.

The American document US2008/0168196, "Communications module interface", discloses an electric interface module to connect operationally the communication module of an electric device, wherein the electric communication module allows for the data communication between the module and any electric device, using either serial or parallel connection. This communication module includes: one or more electric connectors provided in the electric interface, a control unit connected to said at least one or more electric connectors, the control unit being adapted to determine the value of one or more signals applied to at least one by one or more electric connectors and allows for the communication of serial or parallel data through the electric interface depending on the value of one or more signals.

The communication module may use either at least one or one or more electric connectors exclusively for providing one or more signals to the control unit.

The communication system may include a control unit module that is adapted to determine the value of either one or more digital signals of a static logic or one between a low level logic and a high level logic on at least one or more connecting electric.

The communication system may include a control unit module that is connected to two or more electric connectors provided in the electric interface, and adapted to determine the values of the signals applied to two or more electric connectors and change the bit rate of a communication series activated through the interface, as a function of the value of the signals.

The communication system may include a dual gate module for the RAM that is connected to the electric interface to provide the parallel data transfer through the electric interface.

The communication system may include a network circuit module to provide data transfer from the dual gate to the RAM over a network.

Although the inventive concept of modularity of the protocol connection is disclosed, its constructive characteristics do not assure the overall versatility of the module.

One of the objects of the present invention is to provide a communication protocol interface module that, through an opening in the control unit, makes it possible to change a fixture with an electronic circuit for changing the communication protocol and the data link and physical layers of an industrial communication network without the need to use a communication door between two gateway industrial communication networks.

THE DRAWINGS

Said communication protocol interface module object of the present invention will be described hereinbelow with reference to the attached drawings, in which.

DETAILED DESCRIPTION

According to such illustrations, said communication protocol interface module object of the present invention has been conceived to be applied to an electromechanical equipment provided with an opening (notch) for coupling the module in the constructive shape of a drawer that is provided inside same with an electronic board provided with a circuit that defines the communication protocols that may be of the Devicenet, Profibus, Modbus type, or any other communication protocol.

Figure 1:
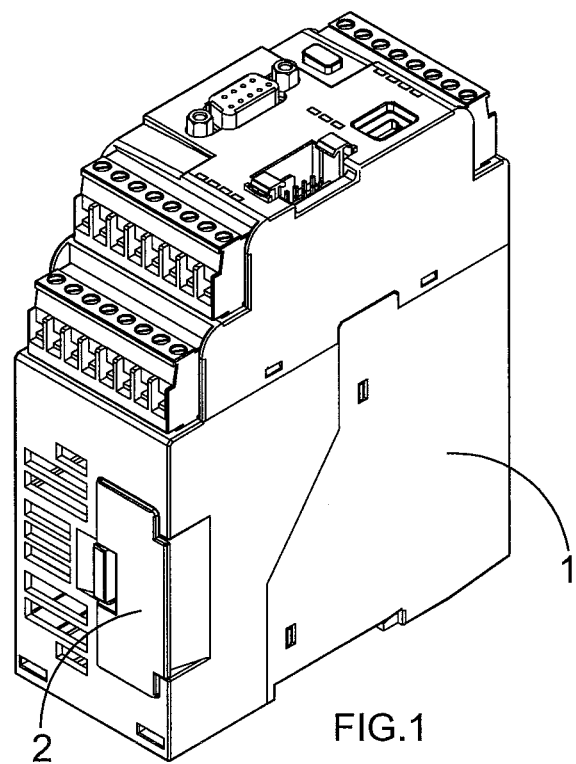
FIG. 1 represents a side perspective view of an electromechanical equipment incorporating the communication protocol interface module.
Figure 2:
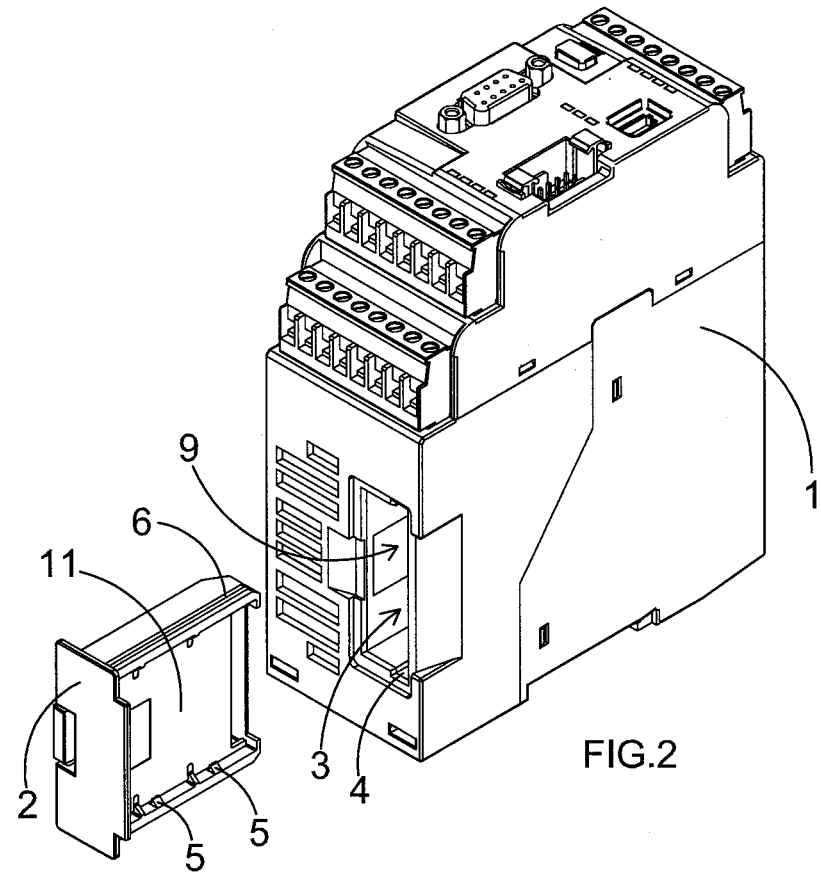
FIG. 2 represents a top perspective view of the same electromechanical equipment illustrated in the previous figure, showing the communication protocol interface module removed from the opening or coupling notch provided in the body of said equipment.

More particularly, the communication protocol interface module is comprised of a substantially parallelepipedical portion deprived of one of its longitudinal walls, defining the molded shape of a drawer (2), see FIG. 2, which is designed to be tightly, axially and connectively fit into a corresponding opening (3) provided in one of the faces of the electromechanical equipment (1), a relay being shown in the illustrated example.

Figure 3:
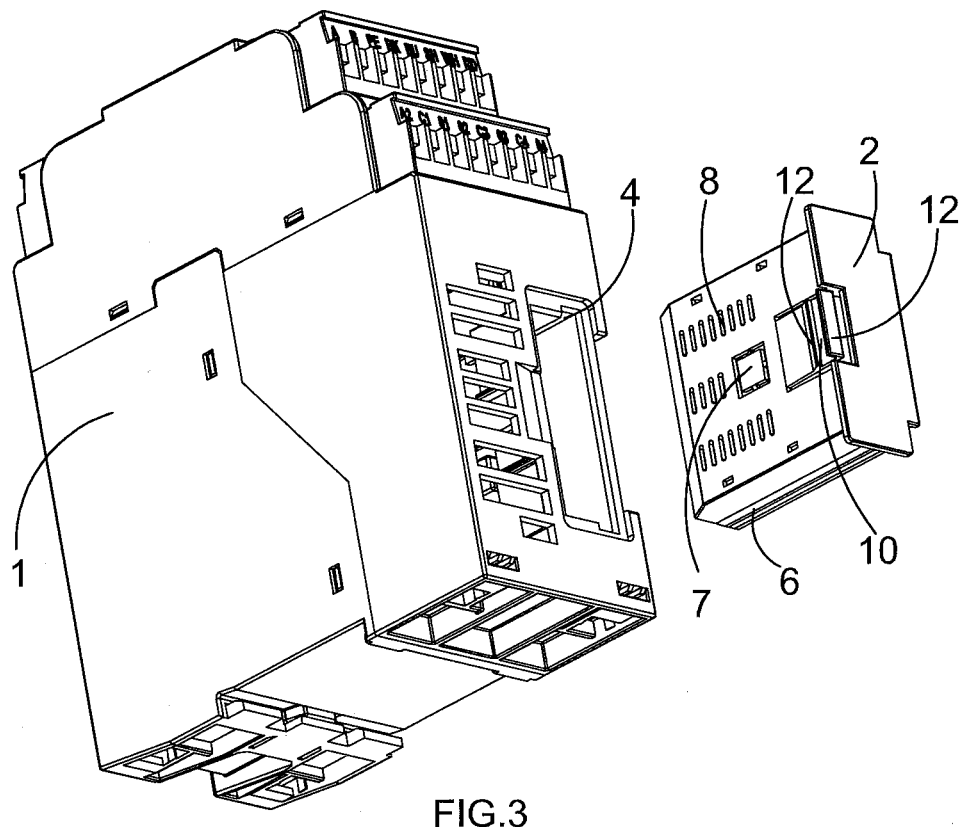
FIG. 3 represents a bottom perspective view of the same electromechanical equipment of the previous figures, showing the communication protocol interface module removed from the opening or coupling notch provided in the body of said equipment.
Figure 4:
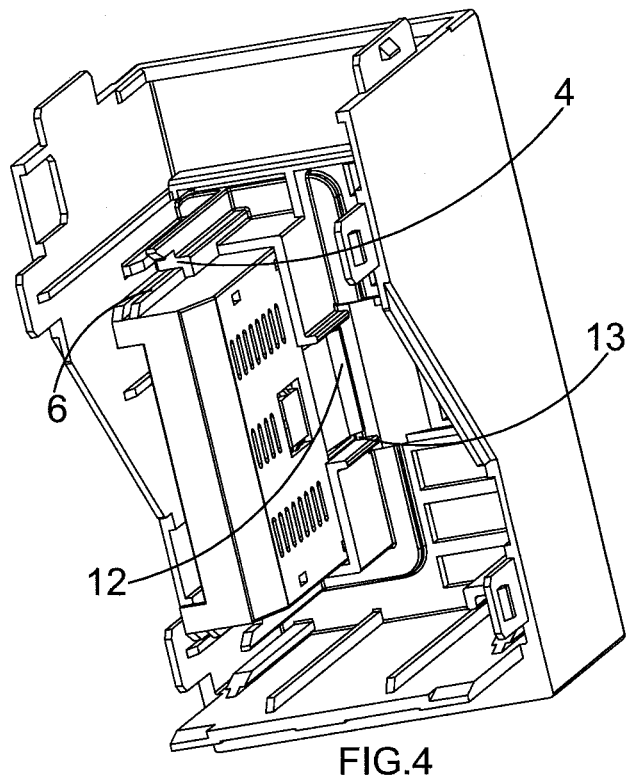
FIG. 4 represents a back perspective view of the same electromechanical equipment of the previous figures, wherein it is partially removed so that the interior thereof may be seen where the communication protocol interface module is coupled.

A notch (4) that functions as a guide for coupling and sliding the module (2) is defined inside the opening (3) having a square shape that matches the external contour of the module (2), said notch being aligned longitudinally and dynamically inside said opening (3) by means of longitudinal shoulders (6) that extend along the whole side of the module (2) and slide along the respective notch (4), see FIGS. 2 and 3.

As can be seen in FIG. 2, the module (drawer) (2) incorporates corresponding vertical ribs (5) beside and inside the sidewalls thereof, said ribs functioning to block the electronic circuit board (11) in which the communication protocol is defined. FIG. 3 illustrates a view of the module (drawer) (2), where an access opening (7) for commutation switches (not illustrated) can be seen on the bottom wall thereof, said switches making it possible to visualize the end point of the network (only required for the Modbus network) when inserted therein.

Tabs (8) for functioning as a heat sink are provided on this bottom wall of the module (2).

The module (2) is also provided with a pair of parallel shoulders (12), defining an insertion gap (10), see FIG. 3, into which a rectangular shoulder (13) provided inside the opening (9) is inserted, thus assuring the retention of the drawer (module) (2) in the equipment (1).

It is the user himself/herself that determines which communication protocol will be used during the purchase of the equipment.

By providing the interface module with this constructive configuration, it is possible to insert a drawer (2) provided with an electronic circuit (11) through an opening (3) in the housing of the control unit (1), in order to change the data link and physical layers of an electromechanical equipment, so that it is possible to exchange the type of communication protocol used, thus providing more flexibility when selecting the communication network to be used, without the need to use a communication gate between two gateway industrial communication networks.

Figure 5:
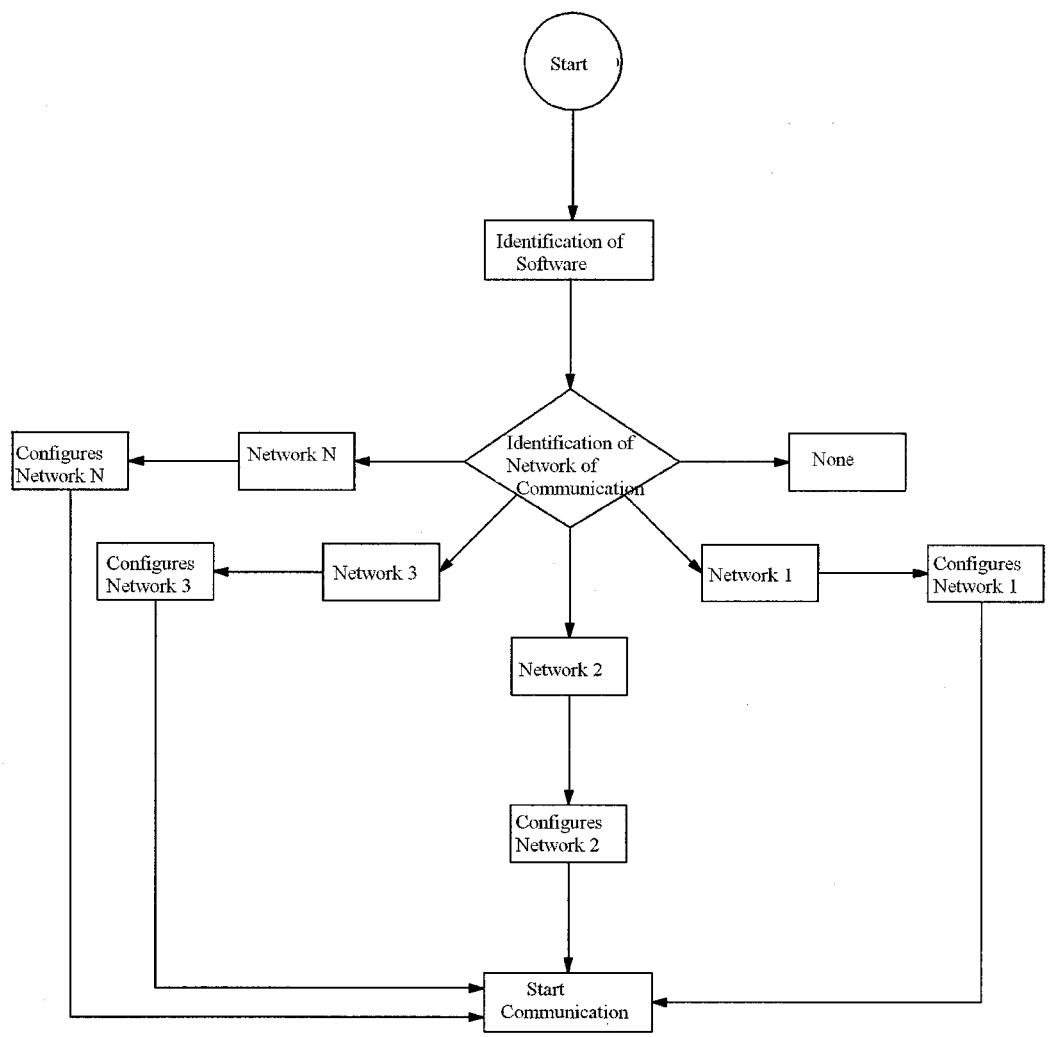
FIG. 5 represents a schematic flowchart of the method for identification of the communication protocol.

In a preferred way, the present invention also contemplates a method for the identification of the communication protocol, as shown in FIG. 5.

The identification of the communication protocol is carried out after the insertion or coupling of the module (2) and when the Central Processing Unit (CPU) is started, where a software incased in the circuit of the electromechanical equipment (1) interprets the signals from the module (2) in order to identify the respective communication protocol with a predefined number; and said number is then stored in a parameter of the system; then the incased software compares the numbers (0, 1, 2, 3, or others) with pre-established and tabulated values, thus allowing for the identification of the communication module that is present in the system, thus configuring the electromechanical equipment (1) for the respective communication protocol and later initialization of the communication between the electromechanical equipment and the communication protocol defined.

The invention claimed is:

1. A communication system, comprising:
a plurality of communication protocol interface modules, each of the plurality of communication protocol interface modules having an electronic circuit board (11) provided with a circuit that defines a communication protocol, which can be the Devicenet, Profibus, Modbus, or any other type of communication protocol, wherein the circuit of each of the plurality of communication protocol interface modules contains a pre-specified number, which is different for different communication protocol interface modules;
an electromechanical equipment having a slot (3) for coupling a communication protocol interface module (2) selected by a user from the plurality of communication protocol interface modules, and having an electronic circuit for receiving signals from the selected communication protocol interface module and identifying the communication protocol based on the received signals; wherein,
the electromechanical equipment stores a plurality of pre-specified numbers, which correspond to the pre-specified numbers of the plurality of communication protocol interface modules, respectively, and thus correspond to the Devicenet, Profibus, Modbus, or any other type of communication protocol, respectively; and
the electronic circuit on the electromechanical equipment interprets the received signals and identifies the pre-specified number corresponding to the selected communication protocol interface module, and thus identifies the communication protocol of the selected communication protocol interface module.

2. The communication system according to claim 1, wherein the communication protocol interface module comprises longitudinal walls, a substantially parallelepipedical portion deprived of one of the longitudinal walls, defining the molded shape of a drawer (2), which is designed to be tightly, axially and connectively fit into a corresponding opening (3) provided in one of the faces of the electromechanical equipment (1).

3. The communication system according to claim 2, wherein the communication protocol interface module comprises a guiding notch (4) for coupling and sliding the module or drawer (2), which is defined inside the slot (3) and has a square shape that matches the external contour of the module or drawer (2), the notch being aligned longitudinally and dynamically inside the slot (3) by means of a longitudinal shoulder (6) that extend along the whole side of the module or drawer (2) and slide along the respective notch (4).

4. The communication system according to claim 2, wherein the module or drawer (2) incorporates corresponding a vertical rib (5) beside and inside the sidewalls thereof, said ribs functioning to block the electronic circuit board (11) in which the communication protocol is defined.

5. The communication system according to claim 2, wherein the module or drawer (2) is provided on the bottom wall thereof with an access opening (7); said bottom wall of the module or drawer (2) also being provided with a plurality of tabs (8).

6. The communication system according to claim 2, wherein the module or drawer (2) is also provided with a pair of parallel shoulders (12), defining an insertion gap (10) into which a rectangular shoulder (13) provided inside an opening (9) is inserted.

* * * * *